US011417784B2

(12) United States Patent
Ueno et al.

(10) Patent No.: US 11,417,784 B2
(45) Date of Patent: Aug. 16, 2022

(54) MULTI-JUNCTION LIGHT ENERGY CONVERSION ELEMENT, DEVICE COMPRISING THE SAME, AND FABRICATION METHOD OF SNZN2N2

(71) Applicant: Panasonic Intellectual Property Management Co., Ltd., Osaka (JP)

(72) Inventors: Koki Ueno, Osaka (JP); Ryosuke Kikuchi, Osaka (JP); Toru Nakamura, Osaka (JP); Takahiro Kurabuchi, Osaka (JP); Yasushi Kaneko, Tokyo (JP); Kazuhito Hato, Osaka (JP); Fumiyasu Oba, Kanagawa (JP); Yu Kumagai, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 116 days.

(21) Appl. No.: 16/223,885

(22) Filed: Dec. 18, 2018

(65) Prior Publication Data
US 2019/0305154 A1    Oct. 3, 2019

(30) Foreign Application Priority Data

Mar. 30, 2018   (JP) .............................. JP2018-067120

(51) Int. Cl.
*H01L 31/032*    (2006.01)
*C25B 1/04*      (2021.01)
(Continued)

(52) U.S. Cl.
CPC ........ *H01L 31/032* (2013.01); *C01B 21/0612* (2013.01); *C25B 1/04* (2013.01);
(Continued)

(58) Field of Classification Search
None
See application file for complete search history.

(56) References Cited

U.S. PATENT DOCUMENTS

2017/0077327 A1 *   3/2017   Hiraga .................. H01L 31/046

FOREIGN PATENT DOCUMENTS

| JP | 11-298024 A | 10/1999 |
| JP | 2003-238104 A | 8/2003 |

(Continued)

OTHER PUBLICATIONS

Wikipedia citation—Multi-junction cells (accessed May 28, 21) (Year: 2015).*

(Continued)

*Primary Examiner* — Shannon M Gardner
(74) *Attorney, Agent, or Firm* — McDermott Will & Emery LLP (57) ABSTRACT

The present disclosure is to provide a multi-junction light energy conversion element including a material having a band gap suitable for a light energy conversion layer located upstream in an incidence direction of light. The present disclosure provides a light energy conversion element, comprising a first light energy conversion layer containing
(Continued)

Incidence Direction of Light $SrZn_2N_2$ and a second light energy conversion layer containing an light energy conversion material. The light energy conversion material has a narrower band gap than the $SrZn_2N_2$.

5 Claims, 10 Drawing Sheets

(51) Int. Cl.
    *C01B 21/06*     (2006.01)
    *C25B 1/55*     (2021.01)

(52) U.S. Cl.
    CPC ............ *C25B 1/55* (2021.01); *C01P 2002/72* (2013.01); *C01P 2002/77* (2013.01); *C01P 2006/40* (2013.01)

(56) References Cited

FOREIGN PATENT DOCUMENTS

| JP | 2008-507464 | A | 3/2008 |
| WO | 2005/113859 | A2 | 12/2005 |
| WO | 2017/065294 | | 4/2017 |

OTHER PUBLICATIONS

Wayback Crawl for Wikipedia citation (Year: 2015).*
Linsey C. Seitz et al., "Modeling Practical Performance Limits of Photoelectrochemical Water Splitting Based on the Current State of Materials Research", ChemSusChem, vol. 7, pp. 1372-1385 (2014).
Lin Zhu et al., "Conversion efficiency limits and bandgap designs for multi-junction solar cells with internal radiative efficiencies below unity", Optics Express, vol. 24, A740-A751 (2016).
Yong-Siou Chen et al., "All Solution-Processed Lead Halide Perovskite-BiVO4 Tandem Assembly for Photolytic Solar Fuels Production", Journal of the American Chemical Society, vol. 137, pp. 974 981 (2015).
Yoyo Hinuma et al., "Discovery of earth-abundant nitride semiconductors by computational screening and high-pressure synthesis", Nature Communications, 7, 11962, Jun. 21, 2016 and Supplementary material.
Murtaza, G. et al., Effect of Varying Pnictogen Elements (Pn=N,P, As,Sb,Bi) on the Optoelectronic Properties of SrZn2Pn2,Zeitschriflluer Naturforschung A [online], Feb. 1, 2018, vol. 73, pp. 285-293, Internet <URL:https://www.degruyter.com/document/doi/10.1515/zna-2017-0388/html>.

* cited by examiner

Incidence Direction of Light

MULTI-JUNCTION LIGHT ENERGY CONVERSION ELEMENT, DEVICE COMPRISING THE SAME, AND FABRICATION METHOD OF SNZN2N2

BACKGROUND

1. Technical Field

The present disclosure relates to a multi-junction light energy conversion element and a device comprising the same. In addition, the present disclosure relates to a fabrication method of $SrZn_2N_2$.

2. Description of the Related Art

A semiconductor is irradiated with light having energy of not less than a band gap of the semiconductor to generate a pair of an electron and a hole in the semiconductor. The semiconductor is used for (i) a solar cell or a photodetector in which the pair is separated to output electric energy and (ii) a hydrogen generation device in which water is split using the pair for chemical reaction of the water splitting to generate hydrogen.

Non-Patent Literature 1 discloses a band gap of a semiconductor suitable for water splitting with sunlight energy (hereinafter, referred to as "solar water splitting"). According to Non-Patent Literature 1, in a device having a tandem structure in which two kinds of semiconductors having band gaps different from each other are stacked, it is suitable that a top cell semiconductor located at the light incidence side has a band gap of approximately 1.8 eV and that a bottom cell semiconductor has a band gap of approximately 1.2 eV.

Non-Patent Literature 2 discloses a band gap of a semiconductor suitable for a solar cell. Non-Patent Literature 2 discloses a multi-junction solar cell in which plural kinds of semiconductors having band gaps different from each other are stacked as light energy conversion layers. According to Non-Patent Literature 2, in a solar cell having a tandem structure in which two kinds of semiconductors having band gaps different from each other are stacked, it is suitable that a first light energy conversion layer located at the outermost side has a band gap of approximately 1.7 eV, and that a second light energy conversion layer located at the backside of the first light energy conversion layer has a band gap of approximately 1.1 eV. Furthermore, according to Non-Patent Literature 2, in a solar cell having a tandem structure in which three kinds of semiconductors having band gaps different from one another are stacked, it is suitable that a first light energy conversion layer located at the outermost side has a band gap of approximately 1.9 eV, that a second light energy conversion layer located at the backside of the first light energy conversion layer has a band gap of approximately 1.4 eV, and that a third light energy conversion layer located at the backside of the second light energy conversion layer has a band gap of approximately 1.0 eV.

Non-Patent Literature 3 discloses a solar water splitting device having a tandem structure in which two kinds of semiconductors having band gaps different from each other are stacked. In the solar water splitting device disclosed in Non-Patent Literature 3, water-splitting reaction proceeds actually due to pseudo-sunlight irradiation.

CITATION LIST

Non-Patent Literature

Non-Patent Literature 1: Linsey C. Seitz et al., "Modeling Practical Performance Limits of Photoelectrochemical Water Splitting Based on the Current State of Materials Research", ChemSusChem, Vol. 7, 1372-1385 (2014)

Non-Patent Literature 2: Lin Z. et al., "Conversion efficiency limits and band gap designs for multi-junction solar cells with internal radiative efficiencies below unity", Optics Express, Vol. 24, A740-A751 (2016)

Non-Patent Literature 3: Chen, Y. S. et al., "All Solution-Processed Lead Halide Perovskite-BiVO$_4$ Tandem Assembly for Photolytic Solar Fuels Production", Journal American Chemical Society, Vol. 137, 974-981 (2015)

SUMMARY

An object of the present disclosure is to provide a multi-junction light energy conversion element including a material having a band gap suitable for a light energy conversion layer located upstream in an incidence direction of light.

The present disclosure provides a light energy conversion element, comprising:

a first light energy conversion layer containing $SrZn_2N_2$; and a second light energy conversion layer containing an light energy conversion material, wherein the light energy conversion material has a narrower band gap than the $SrZn_2N_2$.

The present disclosure is to provide a multi-junction light energy conversion element including a material having a band gap suitable for a light energy conversion layer located upstream in an incidence direction of light.

DETAILED DESCRIPTION OF THE EMBODIMENTS

Hereinafter, the embodiments of the present disclosure will be described.

First Embodiment

Figure 1:
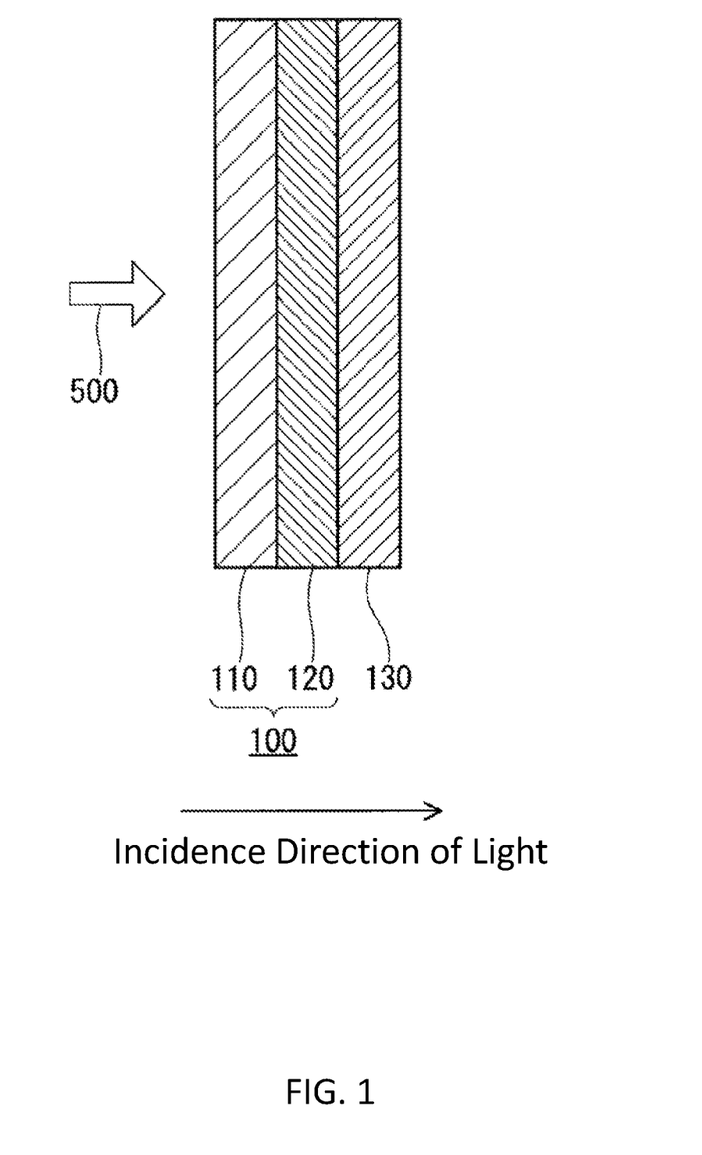
FIG. 1 shows a cross-sectional view of a multi-junction light energy conversion element according to the first embodiment of the present disclosure.

FIG. 1 shows a cross-sectional view of a multi-junction light energy conversion element according to the first embodiment of the present disclosure. As shown in FIG. 1, light 500 traveling from a predetermined direction is incident on the multi-junction light energy conversion element 100 (hereinafter, abbreviated to "element 100"). The element 100 comprises a first light energy conversion layer 110 and a second light energy conversion layer 120. The second light energy conversion layer 120 is located downstream of the first light energy conversion layer 110 in the incidence direction of the light traveling toward the element 100. In other words, first, the light 500 reaches the first light energy conversion layer 110 and travels therethrough. A part of component of the light 500 is absorbed in the first light energy conversion layer 110. Then, the other part of the component of the light 500 which has traveled through the first light energy conversion layer 110 reaches the second light energy conversion layer 120. The light 500 is also absorbed in the second light energy conversion layer 120. In FIG. 1, the referential sign 130 indicates an electrode (i.e., a first electrode 130).

The element 100 shown in FIG. 1 has a two-layer structure in which two light energy conversion layers different from each other are stacked. A multi-junction light energy conversion element in which two light energy conversion layers are included may be referred to as a tandem light energy conversion element.

A first light energy conversion material included in the first light energy conversion layer 110 located upstream in the incidence direction of the light is required to have an appropriate band gap. A second light energy conversion material included in the second light energy conversion layer 120 located downstream in the incidence direction of the light is also required to have an appropriate band gap. The first light energy conversion material has a band gap of, for example, not less than 1.5 eV and not more than 2.2 eV. The second light energy conversion material has a band gap of, for example, not less than 0.8 eV and not more than 1.5 eV.

The first light energy conversion layer 110 contains SrZn$_2$N$_2$ as the first light energy conversion material. SrZn$_2$N$_2$ has the above-mentioned appropriate band gap as the first light energy conversion material.

The second light energy conversion layer 120 contains the second light energy conversion material having a narrower band gap than the first light energy conversion material. The difference between the band gaps of the first and second light energy conversion materials may be not less than 0.2 eV and not more than 1.0 eV. An example of the second light energy conversion material is Si.

In FIG. 1, the first electrode 130 is located downstream of the second light energy conversion layer 120 in the incidence direction of the light; however, the location of the first electrode is not limited to the position shown in FIG. 1. The first electrode may be located upstream or downstream of the first light energy conversion layer 110 in the incidence direction of the light. The first electrode may be an electrical conductor having a transparency such that light travels through the first electrode. An example of the light is visible light. If the first electrode is located upstream of the second light energy conversion layer 120 in the incidence direction of the light, the first electrode is required to be an electric conductor having a transparency such that light travels through the first electrode.

The element 100 shown in FIG. 1 comprises two light energy conversion layers (i.e., the first light energy conversion layer 110 and the second light energy conversion layer 120). However, the multi-junction light energy conversion element of the present disclosure may comprise three or more light energy conversion layers. If the multi-junction light energy conversion element may comprise three or more light energy conversion layers, the first light energy conversion layer and the second light energy conversion layer are located upstream and downstream, respectively, in the incidence direction of the light in the multi-junction light energy conversion element. Hence, in the incidence direction of the light, another light energy conversion layer may be further provided upstream of the first light energy conversion layer. Alternatively, another light energy conversion layer may be further provided between the first and second light energy conversion layers. Still alternatively, another light energy conversion layer may be further provided downstream of the second light energy conversion layer. In FIG. 1, the first light energy conversion layer and the second light energy conversion layer are in contact with each other; however, a joint layer may be provided between the first light energy conversion layer and the second light energy conversion layer.

Hereinafter, SrZn$_2$N$_2$ which is used as the first light energy conversion material will be described.

Figure 2:
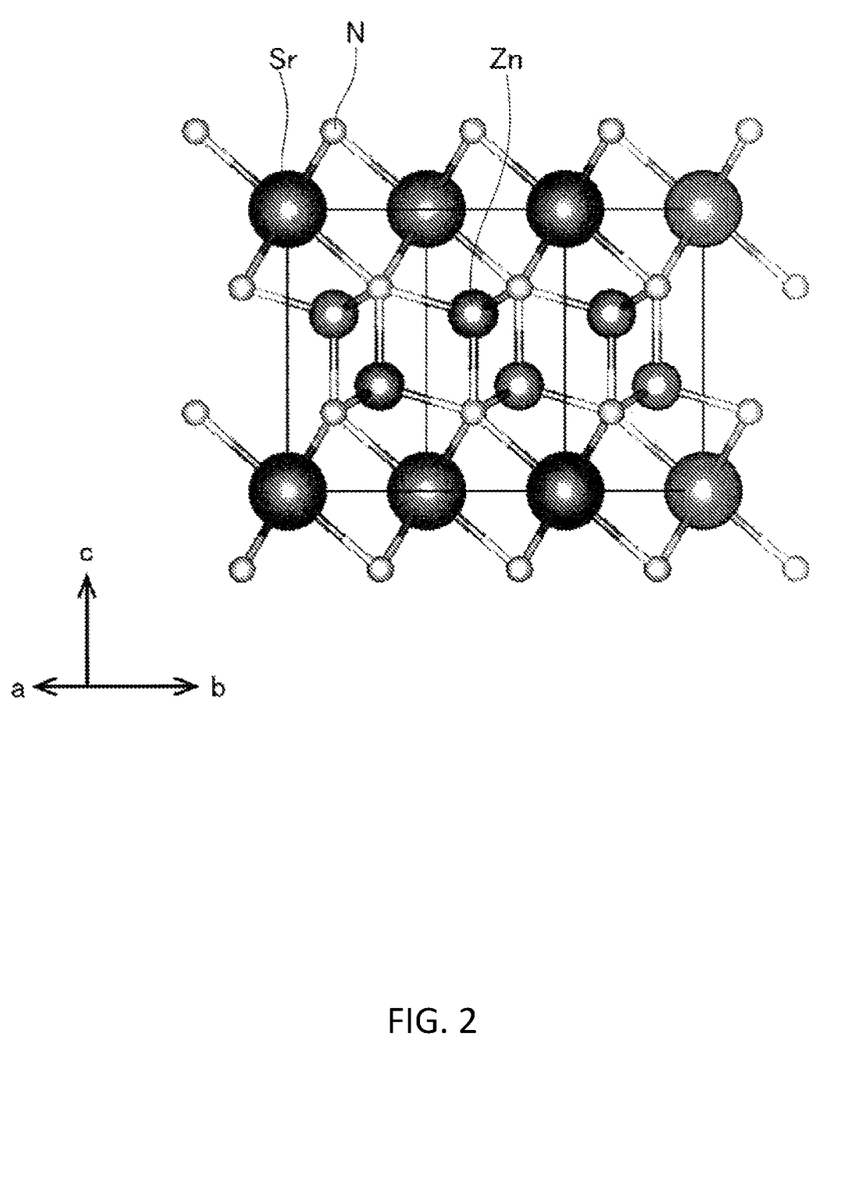
FIG. 2 shows a crystal structure of $SrZn_2N_2$.

FIG. 2 shows a crystal structure of SrZn$_2$N$_2$. The crystal of SrZn$_2$N$_2$ has a trigonal system. Crystal structure optimization of SrZn$_2$N$_2$ was conducted on the basis of first principles calculation using the crystal structure shown in FIG. 2. The first principles calculation was conducted on the density functional theory by a projector augmented wave method (hereinafter, referred to as "PAW method"). In the crystal structure optimization, generalized gradient approximation Perdew-Burke-Emzerhof (hereinafter, referred to as "GGA-PBE") was used for the description of electron density which expresses exchange-correlation term which is interaction between electrons. A band gap of SrZn$_2$N$_2$, an effective mass of an electron, an effective mass of a hole, and a light absorption coefficient spectrum were calculated on the basis of the principles calculation, using the optimized crystal structure. Heyd-Scuseria-Ernzerhof 06 (hereinafter, referred to as "HSE 06") was used for the calculation of the band gap of SrZn$_2$N$_2$, the effective mass of the electron, the effective mass of the hole, and a light absorption coefficient spectrum. It is known that physical properties of a semiconductor can be predicted accurately with the HSE 06.

The effective mass of the electron was calculated from state density under a presumption that the bottom of the conduction band in energy distribution was parabolic. Likewise, the effective mass of the hole was calculated from state density under a presumption that the top of the valence band in energy distribution was parabolic. The light absorption coefficient spectrum was calculated from a dielectric function calculated on the basis of first principles calculation. Table 1 shows the band gap of $SrZn_2N_2$, the effective mass of the electron, and the effective mass of the hole, all of which were calculated as above. Table 1 also shows a light absorption coefficient at the energy which is larger than the band gap by 0.2 eV. As well known in the technical field, in this description, the phrase "light absorption coefficient at the energy which is larger than the band gap by 0.2 eV" is calculated on the basis of a graph (not shown) of the light absorption coefficient spectrum calculated above. The horizontal axis and the vertical axis in the graph represent the energy and the light absorbance, respectively. If the energy is equal to the band gap, the light absorbance is zero. "The light absorption coefficient at the energy which is larger than the band gap by 0.2 eV" is the light absorbance which corresponds to the energy which is larger than the band gap by 0.2 eV. With regard to the effective mass of the electron, in Table 1, a ratio of the effective mass of the electron (me*) to the static mass of the electron (m0) is shown. In other words, the ratio (me*/m0) is shown in Table 1 as the effective mass of the electron. With regard to the effective mass of the hole, in Table 1, a ratio of the effective mass of the hole (mh*) to the static mass of the electron (m0) is shown. In other words, the ratio (mh*/m0) is shown in Table 1 as the effective mass of the hole.

As is clear from Table 1, $SrZn_2N_2$ has a band gap suitable as a material of the light energy conversion layer which is located upstream in the incidence direction of the light and included in the multi-junction light energy conversion element such as a solar cell device or a solar water splitting device. Furthermore, electrons and holes excited by light are required to migrate to the electrodes without deactivation in the light energy conversion element. Alternately, electrons and holes excited by light are required to reach interfaces on which chemical reactions occur. For this reason, in the light energy conversion material, it is desirable that both the effective mass of the electron and the effective mass of the hole are small. For example, a ratio of the effective mass of the electron to the static mass of the electron is less than 1.5. Hereinafter, the ratio of the effective mass of the electron to the static mass of the electron is referred to as an effective mass ratio of the electron. Likewise, for example, a ratio of the effective mass of the hole to the static mass of the electron is less than 1.5. Hereinafter, the ratio of the effective mass of the hole to the static mass of the electron is referred to as an effective mass ratio of the hole. It is desirable that both the effective mass ratio of the electron and the effective mass ratio of the hole are less than 1.5. $SrZn_2N_2$ has an effective mass ratio of the electron of less than 1 and an effective mass ratio of the hole of less than 1. Therefore, $SrZn_2N_2$ has a significantly small effective mass as a semiconductor material. In addition, $SrZn_2N_2$ has a large light absorption coefficient of more than $1 \times 10^4$ cm$^{-1}$ at the energy which is larger than the band gap by 0.2 eV.

Besides, as a result of the mixture of 3d orbital of Zn and 2p orbital N, a top of a valence band is composed of anti-boding orbital. If a defect is introduced in a material having such an electron structure, it is expected that deep level is not formed and that shallow level is formed in the material. The deep level serves as a recombination site of carriers to affect adversely on carrier transportation property. Hence, desirably, the material of the light energy conversion element has a property that the shallow level is formed even if the defect is present.

As above, $SrZn_2N_2$ is significantly potential as a material of a light energy conversion element. In other words, if $SrZn_2N_2$ is used as the first light energy conversion layer of the multi-junction light energy conversion element, sunlight having appropriate wavelengths is absorbed efficiently in the multi-junction light energy conversion element. As a result, the multi-junction light energy conversion element exhibits an excellent carrier transportation property. In this way, the multi-junction light energy conversion element achieves high energy conversion efficiency.

TABLE 1

| Chemical Formula | Band gap [eV] | Effective Mass | | Light Absorption Coefficient at the energy which is larger than band gap by 0.2 eV [cm$^{-1}$] |
|---|---|---|---|---|
| | | me*/m0 | mh*/m0 | |
| $SrZn_2N_2$ | 1.61 | 0.024 | 0.63 | $1.5 \times 10^4$ |

Next, the fabrication method of $SrZn_2N_2$ will be described.

One example of the fabrication method of $SrZn_2N_2$ comprises the following step.

(a) sintering a starting material containing Sr and Zn in a gas containing nitrogen atoms to provide $SrZn_2N_2$.

In the above-mentioned fabrication method, $SrZn_2N_2$ is synthesized. A synthesis method of $SrZn_2N_2$ has not yet reported. In addition, the above-mentioned fabrication method does not comprise a complicated step. So, the above-mentioned fabrication method does not require a special device. The above-mentioned fabrication method allows $SrZn_2N_2$ to be produced in a large scale. Therefore, the above-mentioned fabrication method allows $SrZn_2N_2$ to be produced at low cost.

The starting material is not limited. An example of the staring material is a metal (i.e., Sr or Zn), an alloy (e.g., $SrZn_2$ or $SrZn_{13}$), an oxide (e.g., ZnO or SrO), a composite oxide (e.g., $SrZnO_2$), a nitride (e.g., $Zn_3N_2$ or $Sr_3N_2$), a metal salt (e.g., a metal carbonate or a metal chloride), or a composite material thereof. The starting material may be a metal material of the metal, the alloy, and the composite thereof. In addition, the shape of the starting material is not limited. An example of the shape of the starting material is bulk or powder. Alternatively, a film formed on a substrate may contain the starting material.

Figure 3:
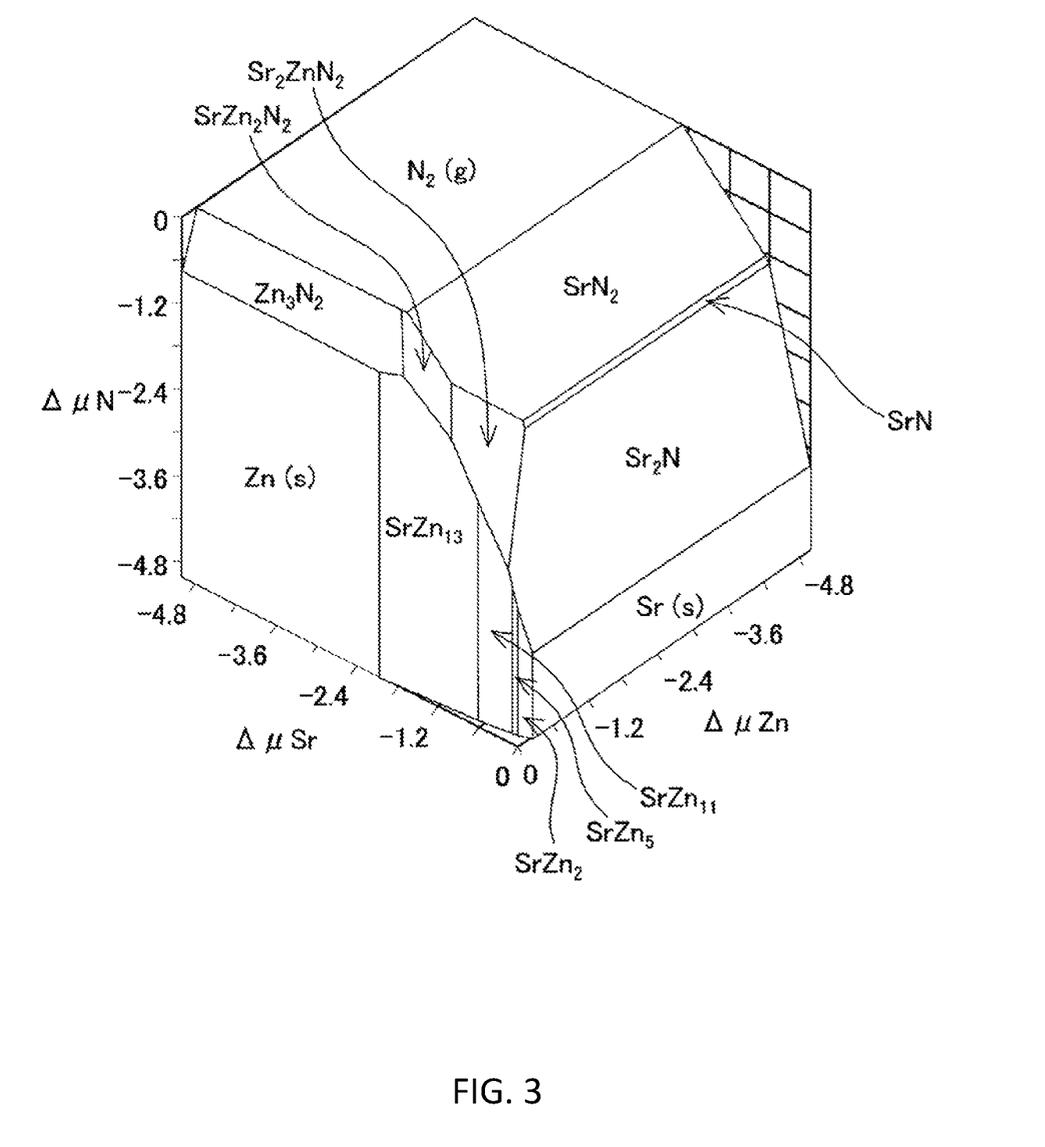
FIG. 3 shows a three-dimensional graph of a Sr-Zn-N system in a chemical potential space.

During the synthesis of a nitride, since a nitrogen molecule is usually poor to react, it is desirable that chemical potential of nitrogen and/or reactivity of the starting material are/is raised. Hereinafter, the chemical potential of nitrogen is referred to as nitrogen potential. As is clear from FIG. 3, high nitrogen potential is required for the synthesis of $SrZn_2N_2$. Therefore, the metal and the alloy each of which has high reactivity with a nitrogen source are suitable as the starting material. These metal materials generally have a significantly less noble oxidation—reduction potential to raise the reactivity. In particular, since the metal Sr (which is one of alkali earth metals) has significantly high reactivity, an alloy containing Sr raises the reactivity of the whole of the starting material. As just described, an alloy containing a metal having high reactivity is useful as a material for the synthesis of $SrZn_2N_2$.

As above described, a film formed on a substrate may contain the starting material. The film formed on the substrate is nitrided to form $SrZn_2N_2$ directly on the substrate, namely, to form the first light energy conversion layer of the multi-junction light energy conversion element easily.

The gas which contains nitrogen atoms and is used to nitride the starting material is not limited. An example of the gas is nitrogen molecule (i.e., $N_2$), ammonia (i.e., $NH_3$), or hydrazine (i.e., $H_2NNH_2$). Ammonia is suitably used, since the starting material is nitrided easily with ammonia, which is commercially available at a low cost. Nitriding process using a gas containing nitrogen atoms can be performed at an atmospheric pressure. Unlike nitriding process performed under vacuum or at high pressure, complicated steps and facilities are not necessary for the nitriding process performed at an atmospheric pressure. Therefore, $SrZn_2N_2$ can be fabricated at a low cost.

Sintering temperature is high, for example, to provide high nitride potential. However, since a Zn metal has a high vapor pressure, the Zn metal may be evaporated during the sintering at high temperature. Hence, the sintering temperature is, for example, not less than 300 degrees Celsius and not more than 700 degrees Celsius, or not less than not less than 500 degrees Celsius and not more than 600 degrees Celsius, to provide a compound having a composition formula of $SrZn_2N_2$ easily. Since Zn is hardly evaporated within a temperature range of not less than 500 degrees Celsius and not more than 600 degrees Celsius, Zn contributes to the reaction at such a temperature range. Within such a temperature range, an ammonia gas is desirably used as a gas containing nitrogen atoms, since the ammonia gas nitrides the starting material easily.

Second Embodiment

Figure 4:
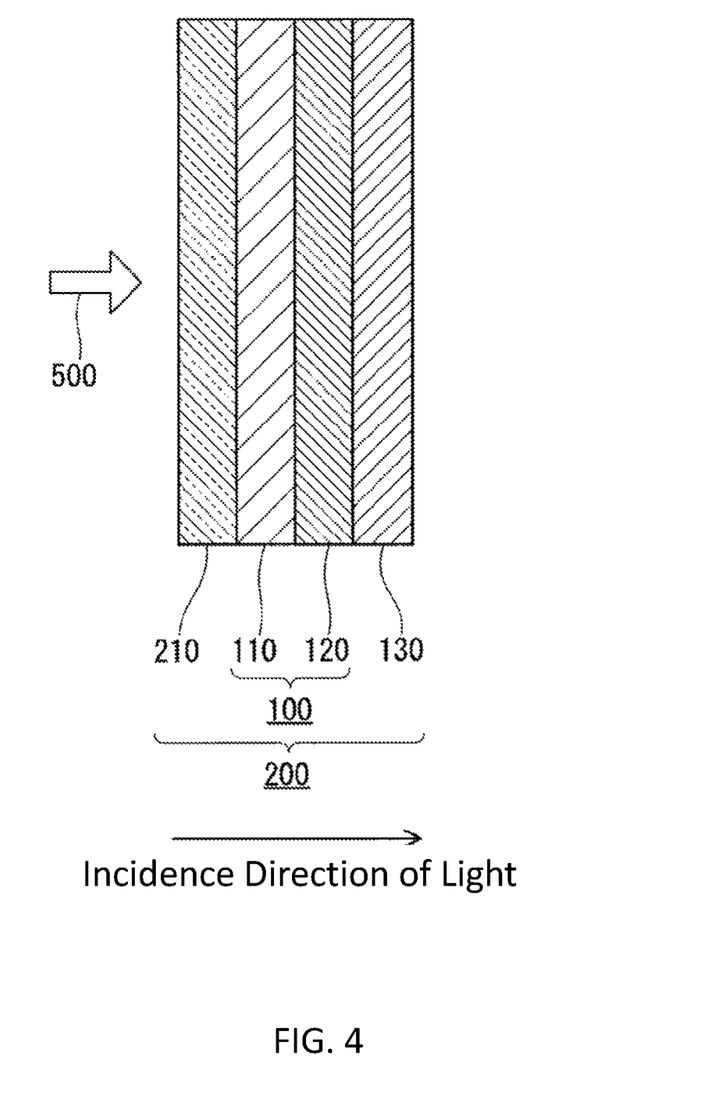
FIG. 4 shows a cross-sectional view of a device according to the second embodiment of the present disclosure.

FIG. 4 shows a cross-sectional view of a device according to the second embodiment of the present disclosure. The device 200 shown in FIG. 4 comprises the multi-junction light energy conversion element 100 according to the first embodiment. The device 200 further comprises the first electrode 130 and a second electrode 210. The first electrode 130 has been described in the first embodiment. However, in the device according to the second embodiment, the first electrode is located upstream of the first light energy conversion layer in the incidence direction of the light or located downstream of the second light energy conversion layer in the incidence direction of the light. The second electrode 210 is located in such a manner that the first light energy conversion layer 110 and the second light energy conversion layer 120 are present between the second electrode 210 and the first electrode 130 in the incidence direction of the light. The joint layer may be provided between the first light energy conversion layer 110 and the second light energy conversion layer 120.

In the device 200, the element 100 is irradiated with light to convert the light into electric energy. In the device 200 shown in FIG. 4, the second electrode 210 is located upstream of the multi-junction light energy conversion element 100 in the incidence direction of the light. In FIG. 4, the second electrode 210 is an electric conductor having a transparency such that light (e.g., visible light) travels through the second electrode 210. Note that the second electrode is located downstream of the second light energy conversion layer, in a case where the first electrode of the multi-junction light energy conversion element is located upstream of the first light energy conversion layer in the incidence direction of the light. In the case, the first electrode has a transparency such that light (e.g., visible light) travels through the first electrode, whereas the second electrode does not have to have a transparency such that light (e.g., visible light) travels through the second electrode.

When the device 200 is irradiated with light, the light travels through the second electrode 210. Then, the light having a short wavelength which corresponds to the band gap of $SrZn_2N_2$ is absorbed by $SrZn_2N_2$, which serves as the first light energy conversion material in the first light energy conversion layer 110. The light having a long wavelength which has traveled through the first light energy conversion layer 110 is absorbed by the second light energy conversion material in the second light energy conversion layer 120. Light energy absorbed in the first light energy conversion layer 110 and the second light energy conversion layer 120 is converted into electric energy. Subsequently, the electric energy is taken out from the first electrode 130 and the second electrode 210.

Third Embodiment

Figure 5:
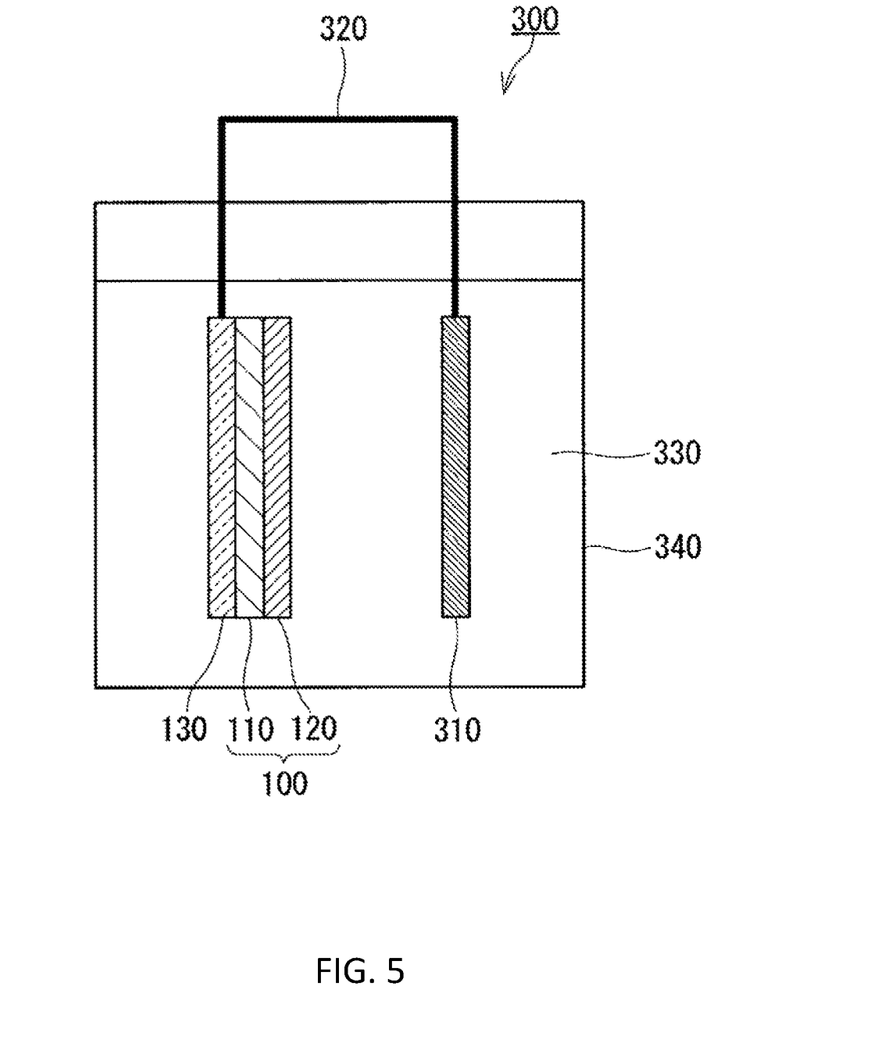
FIG. 5 shows a cross-sectional view of a device according to the third embodiment of the present disclosure.

FIG. 5 shows a cross-sectional view of a device according to the third embodiment of the present disclosure. The device 300 shown in FIG. 5 comprises the multi-junction light energy conversion element 100 according to the first embodiment. The device 300 further comprises a pair of electrodes composed of the first electrode 130 and an electrode 310, a liquid 330, and a container 340. In the device 300, the element 100 is irradiated with light to split water. The first electrode 130 has been described in the first embodiment.

The electrode 310 is electrically connected to the first electrode of the element 100 through an electric wire 320.

The liquid 330 is water or an electrolyte solution. The electrolyte solution is acidic or alkaline. An example of the electrolyte solution is a sulfuric acid aqueous solution, a sulfuric sodium aqueous solution, a sodium carbonate aqueous solution, a phosphate buffer solution, or a boric acid buffer solution.

The container 340 contains the element 100, the electrode 310, and the liquid 330. The container 340 is, for example, transparent. In particular, at least a part of the container 340 may be transparent in such a manner that light travels from the outside of the container 340 to the inside of the container 340.

When the element 100 is irradiated with light, oxygen or hydrogen is generated on the surface of the element 100 and hydrogen or oxygen is generated on the surface of the electrode 310. Light such sunlight travels through the container 340 to reach the element 100. Electrons and holes are generated in the conduction band and the valence band of the light energy conversion material contained in the first light energy conversion layer 110 and the second light energy conversion layer 120 in which the light has been absorbed, respectively. These generated electrons and holes cause water splitting reaction. In a case where the semiconductor contained as the light energy conversion material of the element 100 is an n-type semiconductor, water is split on the surface of the element 100 as shown in the following reaction formula (I) to generate oxygen. In the case, hydrogen is generated on the surface of the electrode 310 as shown in the following reaction formula (II). In a case where the semiconductor contained as the light energy conversion material of the element 100 is a p-type semiconductor, water is split on the surface of the electrode 310 as shown in the following reaction formula (I) to generate oxygen. In the case, hydrogen is generated on the surface of the element 100 as shown in the following reaction formula (II).

$$4h^+ + 2H_2O \rightarrow O_2\uparrow + 4H^+ \quad (I)$$

($h^+$ represents a hole.)

$$4e^- + 4H^+ \rightarrow 2H_2\uparrow \quad (II)$$

In the device 300 shown in FIG. 5, the light may travel through the first electrode 130, and then, the light which has traveled through the first electrode 130 reaches the element 100. Alternately, the light may travel through the electrode 310, and then, the light which has traveled through the electrode 310 reaches the element 100. Note that the electrode 310 has transparency such that light (e.g., visible light) travels through the electrode 310, if the light which has traveled through the electrode 310 reaches the element 100.

Figure 6:
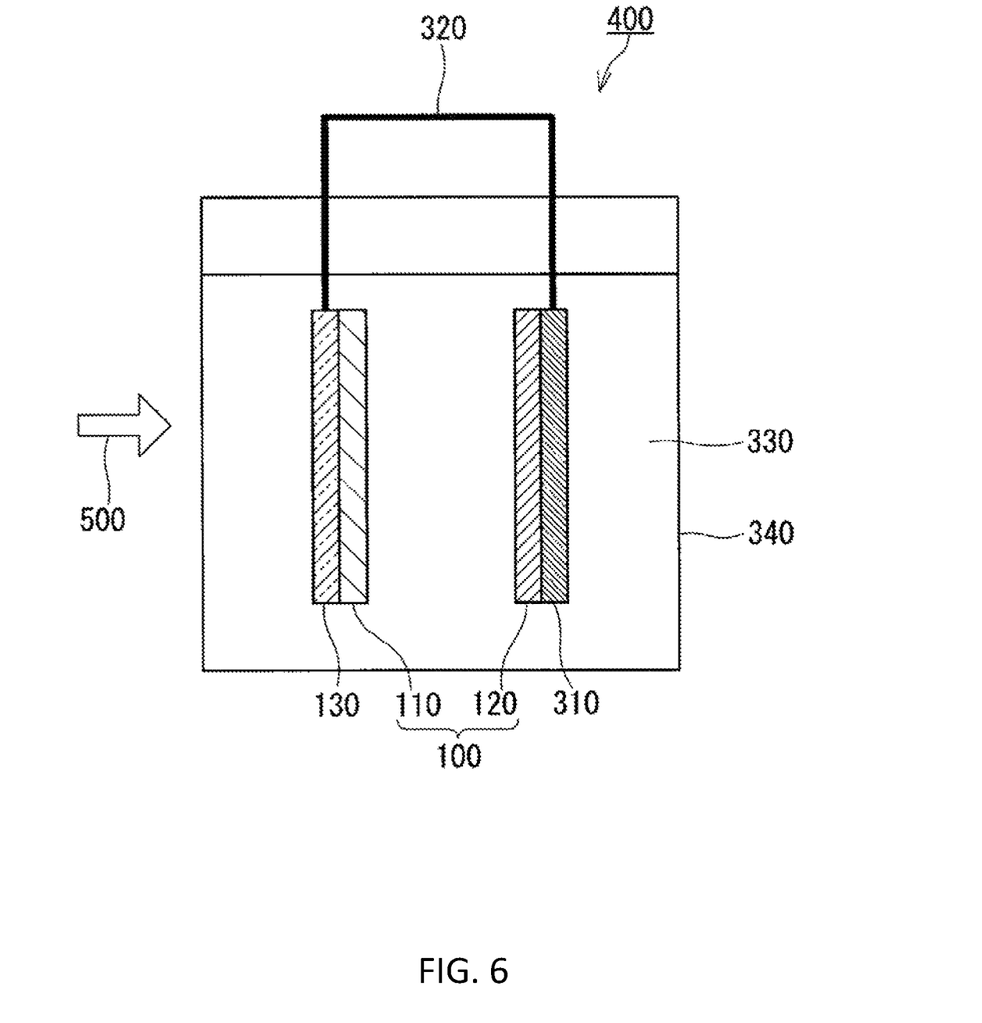
FIG. 6 shows a cross-sectional view of a variation of the device according to the third embodiment of the present disclosure.

The device according to the present disclosure is not limited to the configuration shown in FIG. 5, namely, the configuration in which the liquid 330 is located between the element 100 and the electrode 310 in the incidence direction of the light with respect to the element 100. As shown in a device 400 shown in FIG. 6, the liquid 330 is located between the first light energy conversion layer 110 and the second light energy conversion layer 120 of the element 100 in the incidence direction of the light with respect to the element 100. In the device 400 shown in FIG. 6, the surface areas of the first light energy conversion layer and the second light energy conversion layer may be different from each other in order to improve the light absorption efficiency. In particular, the surface area of the second light energy conversion layer may be larger than the surface area of the first light energy conversion layer.

EXAMPLES

Hereinafter, the multi-junction light energy conversion element according to the present disclosure will be described in more detail with reference to the following examples.

Inventive Example 1

A $SrZn_2$ alloy (product of Kojundo Chemical Laboratory Co., Ltd.) was grounded in a mortar. Subsequently, coarse particles were removed with a 100 micrometer mesh filter to provide $SrZn_2$ fine particles. The $SrZn_2$ fine particles (1.0 gram) were put in a vessel of an alumina boat (made of 99.6% $Al_2O_3$). The alumina boat vessel was loaded into a Tammann tube furnace formed of alumina. The inside of the furnace was evacuated. $N_2$ was supplied to the inside of the furnace in such a manner that the pressure in the inside of the furnace was adjusted to an atmospheric pressure. Then, $NH_3$ was supplied to the inside of the furnace at a rate of 1,000 milliliters/minute for 1 hour to replace the gas contained in the furnace with $NH_3$. The heat in the furnace was started at a temperature increase rate of 100 degrees Celsius/hour. While an $NH_3$ gas was supplied into the furnace at a rate of 1,000 milliliters/minute, the $SrZn_2$ fine particles were sintered at an atmospheric pressure at a holding temperature of 600 degrees Celsius for a holding period of 10 hours. Subsequently, the sintered $SrZn_2$ fine particles were cooled to room temperature, and then, the gas contained in the inside of the furnace was completely replaced with $N_2$. Finally, the product was taken from the furnace.

Figure 7:
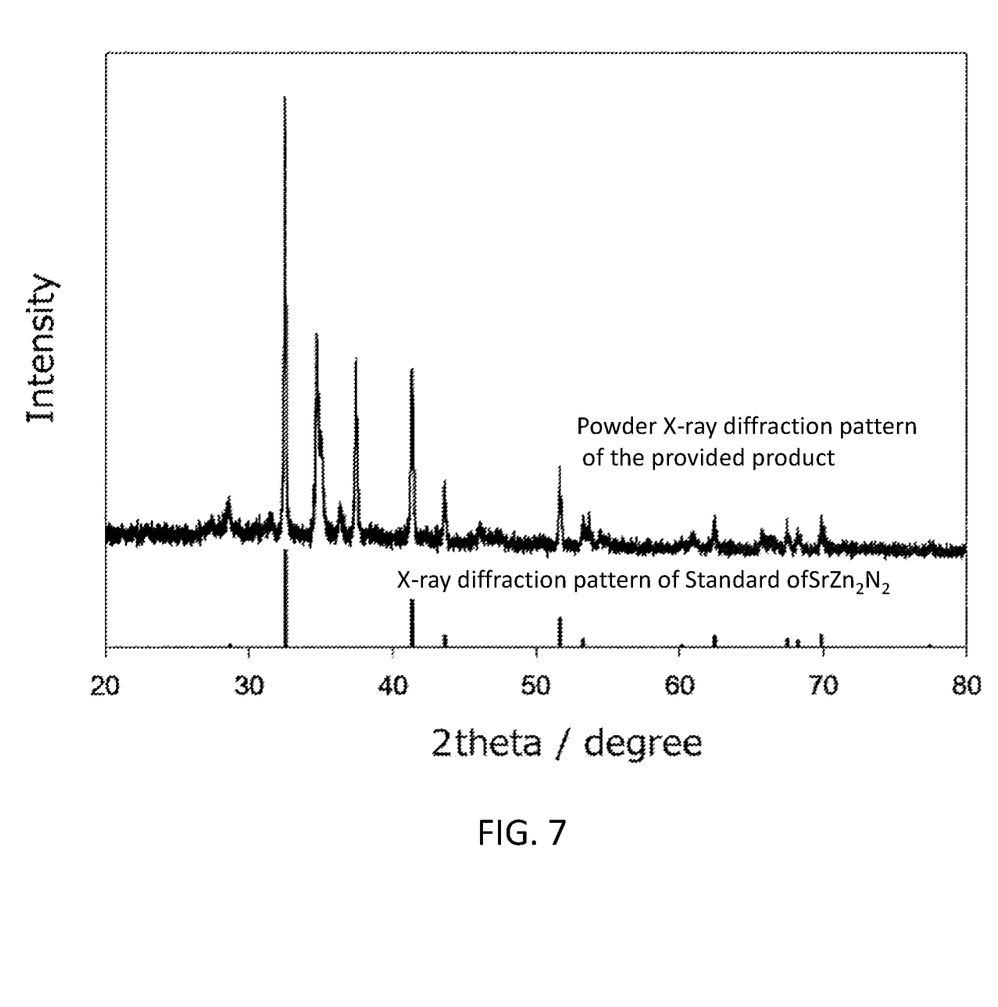
FIG. 7 is a graph showing a powder X-ray diffraction pattern of the provided product and an X-ray diffraction pattern of a standard of $SrZn_2N_2$.

FIG. 7 is a graph showing a powder X-ray diffraction pattern of the provided product and an X-ray diffraction pattern of a standard of $SrZn_2N_2$. The powder X-ray diffraction pattern measurement was performed with a fully automated horizontal multipurpose X-ray diffractometer SmartLab (product of Rigaku Corporation) using a CuKα ray having a measurement wavelength of 0.15405 nanometers.

The X-ray diffraction pattern of the standard of $SrZn_2N_2$ was simulated as below. The peaks of $SrZn_2N_2$ were calculated using software (Visualization for Electronic and STructual Analysis, hereinafter, referred to as "VESTA") on the basis of the structure of $SrZn_2N_2$ calculated from the first principles calculation. The thus-calculated peaks of $SrZn_2N_2$ were peaks at temperature of absolute zero. The lattice constant of $SrZn_2N_2$ was calculated from the peaks of the structure of $SrZn_2N_2$ at temperature of absolute zero with a least squares method. The calculated lattice constant is a=b=0.6122 nanometers and c=0.6224 nanometers. Peaks of the structure of $SrZn_2N_2$ at room temperature were simulated on the basis of the thus-calculated lattice constant.

As understood from FIG. 7, a plurality of peaks which would be derived from a by-product are observed at 2theta/degree of 34°-38°; however, other peaks are assigned to the simulated peaks of the structure of $SrZn_2N_2$ at room temperature. The synthesis of $SrZn_2N_2$ has not yet reported until now; however, the synthesis of $SrZn_2N_2$ is proved by the powder X-ray diffraction pattern.

Figure 8A:
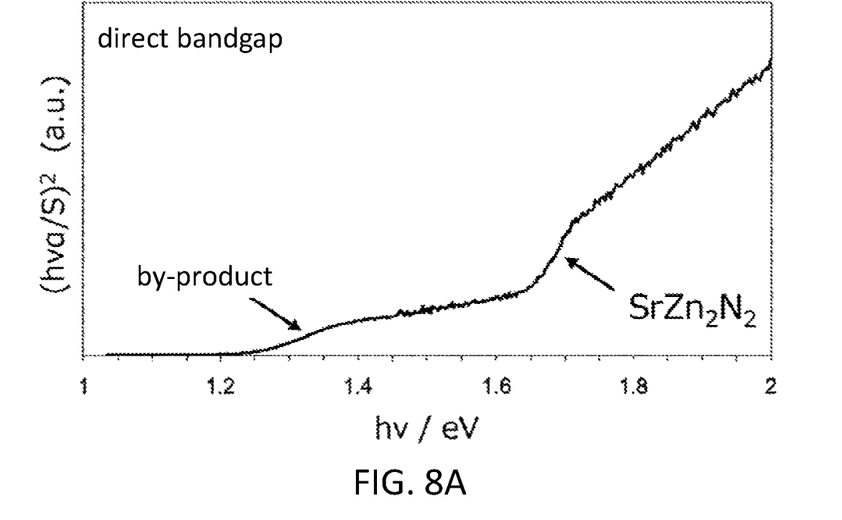
FIG. 8A is a graph showing a light absorption spectrum of the product provided in the inventive example 1, the light absorption spectrum being provided by converting the measured light absorption spectrum into a direct band gap light absorption spectrum.
Figure 8B:
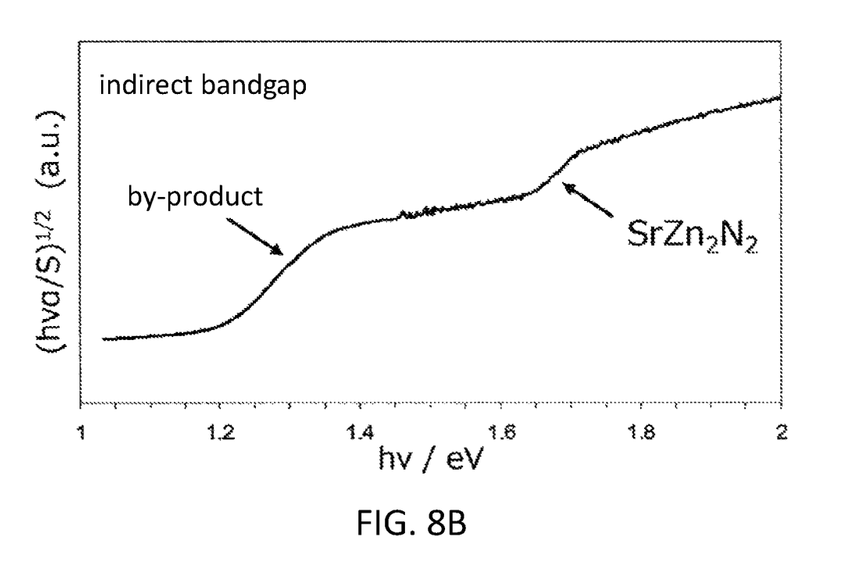
FIG. 8B is a graph showing a light absorption spectrum of the product provided in the inventive example 1, the light absorption spectrum being provided by converting the measured light absorption spectrum into an indirect band gap light absorption spectrum.

FIG. 8A and FIG. 8B are graphs showing light absorption spectra of the product provided in the inventive example 1. FIG. 8A is a graph showing a light absorption spectrum provided by converting the measured light absorption spectrum into a direct band gap light absorption spectrum. FIG. 8B is a graph showing a light absorption spectrum provided by converting the measured light absorption spectrum into an indirect band gap light absorption spectrum. The product was put into a cell having silicon window, and then, the light absorption spectrum of the product was measured within a wavelength range of 250-1,200 nanometers by a scattering reflection method. In both of the direct and indirect band gap light absorption spectra, the band gap was approximately 1.65 eV. Precipitous rise of the light absorption was exhibited. The light absorption derived from the by-product exhibited 1.2 eV. These results revealed that $SrZn_2N_2$ has a band gap suitable for the first light energy conversion layer in the multi-junction light energy conversion element.

Comparative Example 1

In an $N_2$-atmospheric glove box, $Zn_3N_2$ powder (product of Alfa Aesar) and $Sr_3N_2$ powder (product of Kojundo Chemical Laboratory Co., Ltd.) were mixed in a mortar. The molar ratio of $Zn_3N_2$:$Sr_3N_2$ was 2:1. The powder mixture was put into a silicon tube in which one end was closed and the other end was open. The silicon tube had an external diameter of 13 millimeters and an internal diameter of 10 millimeters. A balloon was attached to the other end of the silicon tube to maintain airtightness in the silicon tube. The silicon tube was moved from the $N_2$-atmospheric grove box, and then, the other end of the silicon tube was melt with a gas burner. In this way, the other end of the silicon tube was sealed to provide an ample in which the powder mixture and $N_2$ were put. The provided ample was loaded into an electric furnace. The powder mixture was heated at a temperature increase rate of 10 degrees Celsius/minute. The powder mixture was sintered at atmospheric pressure at temperature of 600 degrees Celsius for three days. Finally, the sintered powder mixture was cooled naturally.

Figure 9:
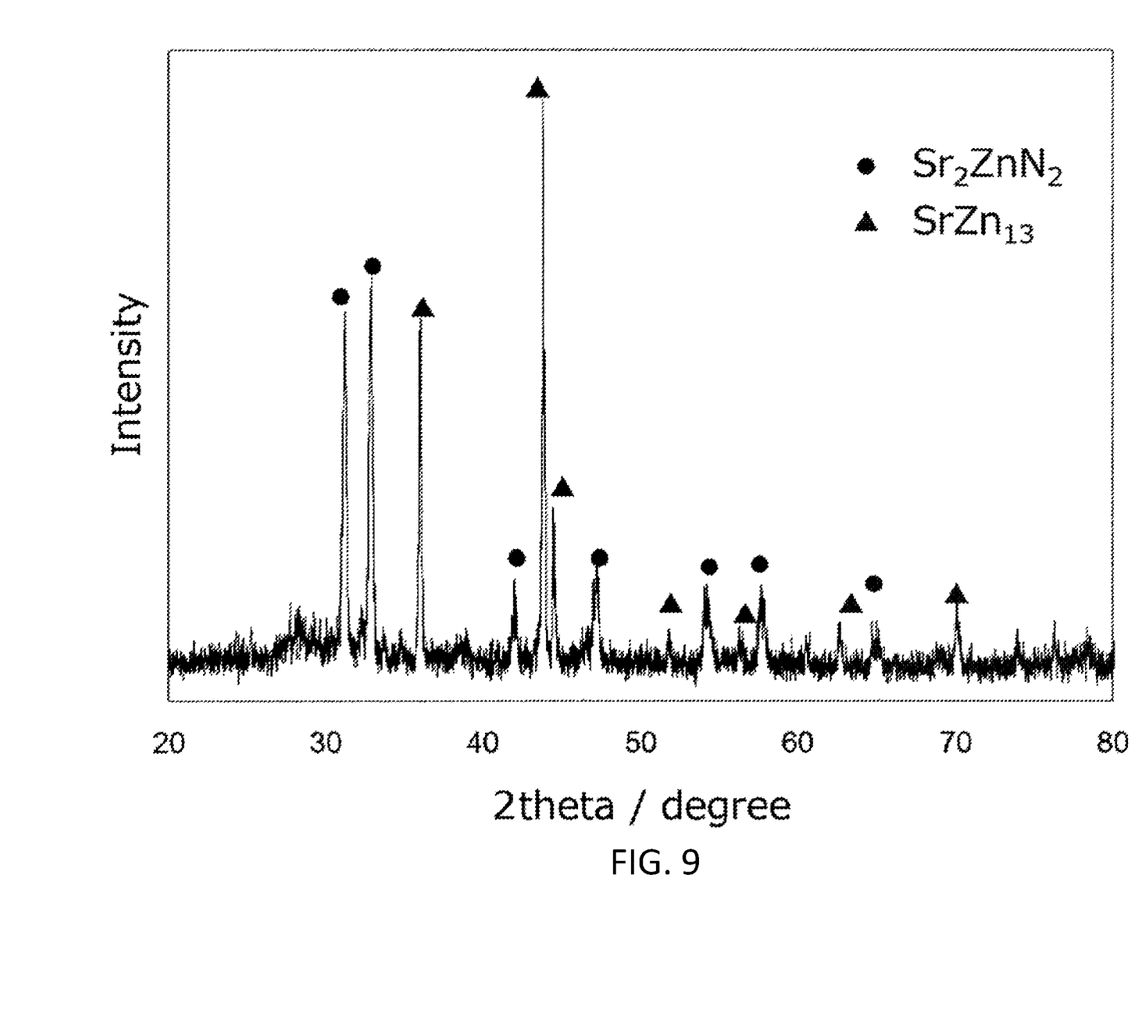
FIG. 9 shows a graph showing a powder X-ray diffraction pattern of the product provided in the comparative example 1.

FIG. 9 shows a graph showing a powder X-ray diffraction pattern of the product provided in the comparative example 1. The powder X-ray diffraction pattern measurement was performed with a fully automated horizontal multipurpose X-ray diffractometer (product of Rigaku Corporation) using a CuKα ray having a measurement wavelength of 0.15405 nanometers. In the powder X-ray diffraction pattern of the product, the peaks derived from $SrZn_2N_2$ and peaks derived from $SrZn_{13}$ appears; however, no peaks derived from $SrZn_2N_2$ appear. Note that peak patterns described in the inorganic crystal structure database (hereinafter, referred to as "ICSD") were referred to as the standard peaks of $SrZn_2N_2$ and $SrZn_{13}$. The chemical potential drawing shown in FIG. 3, in the nitrogen potential in the comparative example 1, it appears that $Sr_2ZnN_2$ and $SrZn_{13}$ are produced; however, $SrZn_2N_2$ is not produced. It was impossible to provide the higher nitrogen potential in the comparative example 1, since the starting material was decomposed and Zn was evaporated at temperature of 600 degrees Celsius or more. On the other hand, in the inventive example 1, it appears that the synthesis of $SrZn_2N_2$, which requires the higher nitrogen potential, was achieved by using high nitrogen potential of $NH_3$ and high reactivity of the starting material. Therefore, the synthesis method according to the inventive example 1 is useful for achievement of the high nitrogen potential in the synthesis of a nitride.

Figure 10:
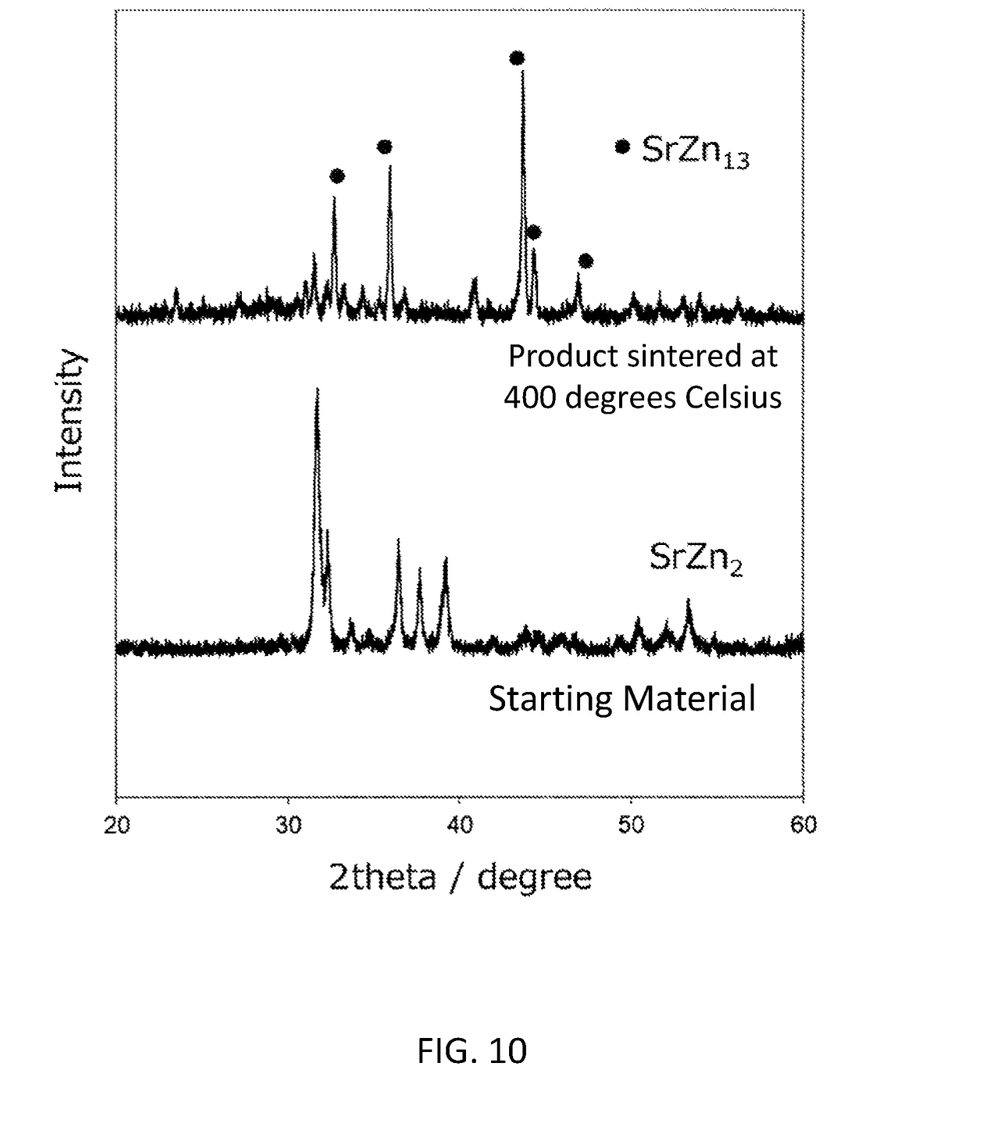
FIG. 10 shows powder X-ray diffraction patterns of (i) SrZn$_2$ powder used as the starting material in the inventive example 1 and (ii) a product provided in the inventive example 1 by sintering the SrZn$_2$ powder at temperature of 400 degrees Celsius under an ammonia atmosphere.

Note that the starting material in the inventive example 1 was $SrZn_2$; however, $SrZn_2N_2$ is provided in a case of using $SrZn_{13}$ as a starting material. FIG. 10 shows a powder X-ray diffraction pattern of $SrZn_2$ powder used as the starting material in the inventive example 1. FIG. 10 also shows a powder X-ray diffraction pattern of a product provided by nitriding the $SrZn_2$ powder at temperature of 400 degrees Celsius under an $NH_3$ atmosphere. These powder X-ray diffraction pattern measurements were performed with a fully automated horizontal multipurpose X-ray diffractometer (product of Rigaku Corporation) using a CuKα ray having a measurement wavelength of 0.15405 nanometers. The nitriding of the $SrZn_2$ powder at temperature of 400 degrees Celsius under an $NH_3$ atmosphere was performed similarly to the case of the inventive example 1, except that the holding temperature of sintering of the $SrZn_2$ was not 600 degrees Celsius but 400 degrees Celsius. The powder X-ray diffraction pattern shown in FIG. 10 revealed that substantially all of $SrZn_2$ was decomposed through nitriding process at temperature of 400 degrees Celsius and that $SrZn_{13}$ was produced. In other words, in the inventive example 1, $SrZn_2N_2$ was synthesized from $SrZn_2$ through $SrZn_{13}$. Hence, $SrZn_2N_2$ is provided, even if $SrZn_{13}$ is used as the starting material in place of $SrZn_2$.

INDUSTRIAL APPLICABILITY

The multi-junction light energy conversion element according to the present disclosure includes a material having a band gap suitable for a light energy conversion layer located upstream in an incidence direction of light. Hence, the multi-junction light energy conversion element according to the present disclosure can be used for a device such as a solar cell or solar water splitting.

REFERENTIAL SIGNS LIST

100: Multi-junction light energy conversion element
110: First light energy conversion layer
120: Second light energy conversion layer
130: First electrode
200: Device
210: Second electrode
300, 400: Device
310: Electrode
320: Electric wire
330: Solution
340: Container
500: Light

The invention claimed is:

1. A light energy conversion device, comprising:
a light energy conversion element;
a first electrode; and
a second electrode,
wherein the light energy conversion element, consisting of:
a first light energy conversion layer as a single layer containing $SrZn_2N_2$; and
a second light energy conversion layer containing an light energy conversion material,
wherein the light energy conversion material has a narrower band gap than the $SrZn_2N_2$,
the first light energy conversion layer of the light energy conversion element is present between the second light energy conversion layer of the light energy conversion element and the second electrode,
the second light energy conversion layer of the light energy conversion element is present between the first light energy conversion layer of the light energy conversion element and the first electrode, and
the second electrode is an electric conductor having a transparency such that light travels through the second electrode.

2. A light energy conversion device, comprising:
a light energy conversion element;
a first electrode; and
a second electrode,
wherein the light energy conversion element, consisting of:
a first light energy conversion layer as a single layer containing $SrZn_2N_2$;
a second light energy conversion layer containing an light energy conversion material; and
a joint layer provided between the first light energy conversion layer and the second light energy conversion layer,
wherein the light energy conversion material has a narrower band gap than the $SrZn_2N_2$,
the first light energy conversion layer of the light energy conversion element is present between the second light energy conversion layer of the light energy conversion element and the second electrode,
the second light energy conversion layer of the light energy conversion element is present between the first light energy conversion layer of the light energy conversion element and the first electrode, and
the second electrode is an electric conductor having a transparency such that light travels through the second electrode.

3. The device according to claim 1, wherein the second electrode is located upstream of the light energy conversion element in an incidence direction of the light.

4. The device according to claim 1, wherein the light is sunlight.

5. The light energy conversion element according to claim 1, wherein the second light energy conversion layer of the light energy conversion element is a single layer.

* * * * *